United States Patent [19]
Tompkins

[11] 4,023,048
[45] May 10, 1977

[54] SELF-SCANNING PHOTO-SENSITIVE CIRCUITS

[75] Inventor: James Darrell Tompkins, Essex, Vt.

[73] Assignee: International Business Machines Corporation, Armonk, N.Y.

[22] Filed: Dec. 15, 1975

[21] Appl. No.: 641,193

[52] U.S. Cl. .............................. 307/246; 307/208; 307/221 C; 307/251; 307/311; 307/DIG. 4
[51] Int. Cl.² ................ H03K 17/10; H03K 17/60; H03K 3/42; H03K 23/12
[58] Field of Search ........... 307/208, 221 R, 221 C, 307/246, 251, 311, DIG. 4

[56] References Cited
UNITED STATES PATENTS 3,932,773   1/1976   Luscher et al. ................ 307/246 X

OTHER PUBLICATIONS

Lewis et al., "Two-Stage, Single-Phase Driver Circuit"; *IBM Tech. Discl. Bull.*; vol. 17, No. 10, p. 2837; 3/1975.
Anderson et al., "Decoding Scheme for MOS Random-Access Memories"; *IBM Tech. Discl. Bull.*; vol. 17, No. 10, pp. 2832–2833; 3/1975.
SIMI, "Field–Effect Transistor Drive Circuit"; *IBM Tech. Discl. Bull.*; vol. 17, No. 4, p. 1120; 7/1974.

*Primary Examiner*—John S. Heyman
*Assistant Examiner*—L. N. Anagnos
*Attorney, Agent, or Firm*—Stephen J. Limanek

[57] ABSTRACT

High density self-scanning photo-sensitive circuits employ a voltage transfer mode with charge amplification. The circuits include a field effect transistor and a capacitor coupled from the gate electrode of the transistor through a diode to the source electrode of the transistor. A photodiode is connected to the gate electrode of the transistor. Means are provided for precharging the capacitor to substantially the threshold voltage of the transistor while applying an additional constant voltage of predetermined magnitude to the gate electrode to operate the transistor in its linear region. An analog signal from the photo-diode is also applied to the gate electrode of the transistor which is amplified by the transistor with little or no threshold voltage loss. In a preferred array of these circuits, the photo-diodes or light sensitive devices are arranged linearly, in quantities of a thousand or more, and video signals from alternate devices are coupled to one or two common busses through individual gating transistors.

7 Claims, 2 Drawing Figures

SELF-SCANNING PHOTO-SENSITIVE CIRCUITS

BACKGROUND OF THE INVENTION

1. Field of the Invention

This invention relates to a light sensitive element signal transfer circuit having amplification means. The circuit may be used in a scanner environment wherein alternate elements of a linear array of the light sensitive elements are coupled to one of two video output lines. The array is formed as integrated circuits in a semiconductor substrate.

2. Description of the Prior Art

Light sensitive device arrays formed in integrated semiconductor circuits, e.g., as an array of photo-diodes, use diffusions providing p-type or n-type regions in an n-type or p-type silicon substrate, respectively, to collect holes or electrons generated by electromagnetic radiation on or around the diffused region. The charge so collected depends on the intensity and time of exposure of the diffused region to the radiation. The size of the diffused regions is often a limiting factor in providing suitable arrays since the charge varies directly as the area of the diffused regions. When a reduced exposure time or faster integration time is required, the area of the diffused region must be reduced to maintain a given voltage swing, e.g., on the photo-diode. The variation in charge is equal to the capacitance of the photo-diode times the voltage swing and is also equal to the intensity of the radiation times the time of exposure times the diffused area times optical constants. As is known, the photo-diode capacitance is due to the diffusion capacitance and the effective diffused area is the area of the optical window at the diffused region.

In order to transfer signals from the photo-diodes to signal processing circuits, a substantial amount of change in charge had to be produced and, therefore, large photo-diodes and long exposure times were required.

In *Electronics*, May 1, 1967, pp. 75-78, there are described light sensitive arrays utilizing devices operating in the storage mode which sum the light or radiation falling on the diffused region or junction over a period of time, with readout being provided in a relatively short time interval. In U.S. Pat. No. 3,770,967, filed Feb. 24, 1972, and having a common assignee, there is disclosed a light sensitive element coupled to an amplifying circuit for transfer of signals to appropriate signal processing circuits. This circuit arrangement is suitable for light detection but it employs direct current coupling and does not use light integration or charge accumulation techniques. In U.S. Pat. No. 3,814,846, filed Jan. 20, 1972, there is disclosed a self-scanning photo-detection array wherein the light sensitive devices are arranged in a row, with alternate devices being sequentially sensed and coupled directly to one of two video output lines. The signals produced at the two video lines of this array have a relatively low magnitude and, consequently, a low signal to noise ratio.

Transistor circuits are known, e.g., in U.S. Pat. No. 3,506,851, filed Dec. 14, 1968, and U.S. Pat. No. 3,631,267, filed June 18, 1970, which employ bootstrapping techniques for compensating the threshold voltage drop across output devices for logic circuits, but circuits are not known for analog circuits which are capable of eliminating or minimizing the threshold voltage loss in a light sensitive array which includes capacitors associated with light sensitive devices and analog signals such as photo-diodes.

SUMMARY OF THE INVENTION

It is an object of this invention to provide improved self-scanning photo-sensitive circuits which employ a voltage transfer mode with signal charge amplification.

It is another object of this invention to provide an improved photo-sensitive circuit which uses smaller photo-sensitive devices, such as photo-diodes.

Yet another object of this invention is to provide an improved photo-sensitive circuit which requires reduced exposure time resulting in shorter integration time per cycle.

A further object of this invention is to provide an array of photo-sensitive devices having improved linearity.

Still another object of this invention is to provide a photo-sensitive circuit which operates with reduced light intensities.

Yet a further object of this invention is to provide a photo-sensitive circuit which eliminates or at least minimizes loss of video signal, with signal distortion being reduced to less than one percent.

Still a further object of this invention is to provide an improved high density long linear array of photo-sensitive devices wherein a constant illumination provides substantially the same output signal from each of the devices.

In accordance with the teachings of this invention small charge signals indicative of electromagnetic radiation are amplified with virtually no loss of signal onto a common bus through individual field effect transistors connected as source followers. A photo-sensitive device, such as a photo-diode, back biased by an appropriate given voltage, is coupled to the control or gate electrode of the source follower and means are provided to apply to the control or gate electrode a voltage substantially equivalent to the threshold voltage of the source follower in addition to a constant voltage having a magnitude substantially equal to the given voltage applied to the photo-diode.

In one embodiment of the invention, the self-scanning photo-sensitive circuits of this invention comprise photo-diode charge amplification circuits for amplifying photo-signals which include first and second field effect transistors and a capacitor coupled from the gate electrode of the first transistor through the second transistor to the source electrode of the first transistor, the second transistor is connected as a diode with its gate electrode connected to its drain electrode and the source electrode of the first transistor. Means are provided for precharging the capacitor to substantially the threshold voltage of the first and second transistors and for applying a voltage of predetermined magnitude to the common point between the capacitor and the second field effect transistor. A photo signal from a capacitive source such as a photo-diode is then applied to the gate electrode of the first transistor. In a preferred embodiment, the capacitance of the signal source is equal to the capacitor connected between the common point and the gate electrode of the first transistor. In a preferred array of these circuits, the light sensitive devices or photo-diodes of the circuits are arranged linearly and alternate circuits are coupled to one of two common busses through individual gating transistors.

The foregoing and other objects, features and advantages of the invention will be apparent from the following more particular description of the preferred embodiments of the invention, as illustrated in the accompanying drawings.

DESCRIPTION OF THE PREFERRED EMBODIMENT

Figure 1:
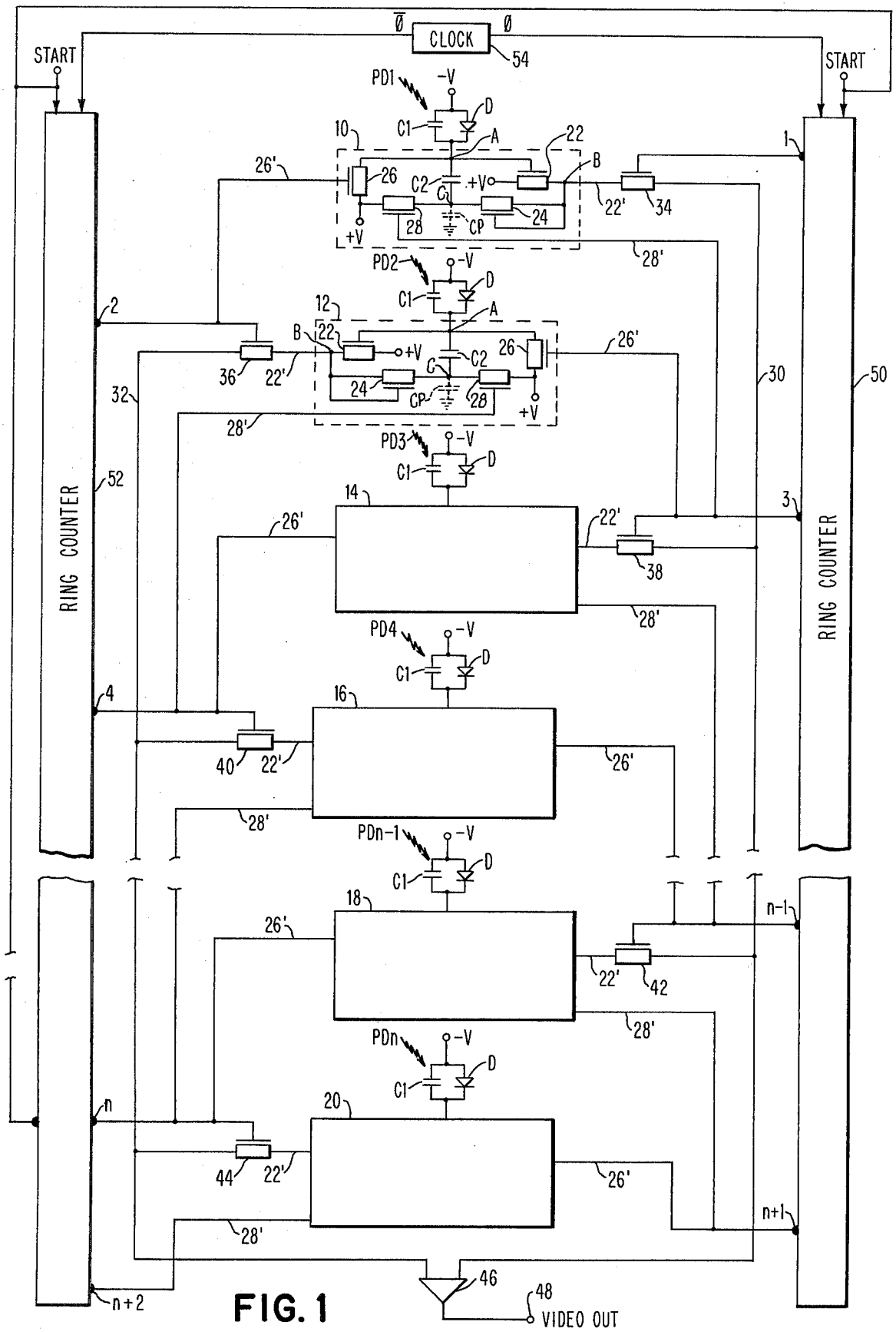
FIG. 1 is a circuit diagram, partly in block form, illustrating circuits of the present invention.

Referring to FIG. 1 in more detail, there is shown the self-scanning light sensitive array of the present invention having linearly arranged photo-diodes PD1, PD2, PD3, PD4, PDn-1 and PDn. Each of these photo-diodes is connected to a respective one of the photo-diode charge amplification circuits 10, 12, 14, 16, 18 and 20. Each of the photo-diodes is a p-n junction formed by a diffusion in a semiconductor substrate which is reverse-biased to act as a first capacitor C1 with a current source D, indicated in the drawing by a conventional diode symbol.

Each of the photo-diode charge amplification circuits 10, 12, 14, 16, 18 and 20 includes a first field effect transistor 22 which has its gate electrode connected to one terminal of the photo-diode PD1 at node A, with the other terminal of the photo-diode PD1 being connected to a negative potential source −V. A second field effect transistor 24 and a second capacitor C2, preferably having a capacitance equal to that of capacitor C1, are serially connected between the source electrode, node B, of transistor 22 and the gate electrode, node A, of transistor 22. The drain electrode of transistor 22 is connected to a positive potential source +V and the source electrode is connected to a conductor 22'. Transistor 24 is arranged in the form of a diode by having its gate electrode connected to its drain at node B with its source electrode connected to capacitor C2 at node C. A third field effect transistor 26 is connected between the positive potential source +V and node A and a fourth field effect transistor 28 is connected between the source +V and node C.

The output signals, which are derived from node B, of the amplification circuits, are applied to common video output lines 30 and 32 through transfer field effect transistors 34, 36, 38, 40, 42 and 44, with transistors 34, 38 and 42 being connected to line 30 and transistors 36, 40 and 44 being connected to line 32. The output lines 30 and 32 are connected to any suitable amplifier 46 which may have a common output terminal 48 or to any desired separate output circuits. The gate electrodes of transfer transistors 34, 38 and 42 are connected to output terminals 1, 3 and n-1 of a first ring counter 50 and the gate electrodes of transfer transistors 36, 40 and 44 are connected to output terminals 2, 4 and n of a second ring counter 52. The ring counters 50 and 52 may be any conventional counters or shift registers which under the control of a start pulse and appropriate clock pulses of a given frequency produce output pulses at different output terminals sequentially. The counters 50 and 52 are preferably formed on the same substrate or chip as the light sensitive array. In FIG. 1, a clock 54 produces two sets of clock pulses or timing signals of the same frequency but of different phase to the ring counters 50 and 52. The clock pulses applied to ring counter 50 may be considered to be of a given phase $\phi$ and the clock pulses applied to the ring counter 52 may be considered to be 180° out of phase with the given phase and, therefore, identified as having a $\bar{\phi}$ phase.

Each of the photo-diode charge amplification circuits, such as 10, coupled to the photo-diodes, such as PD1, operates in the following manner. A transfer pulse from terminal 1 of ring counter 50 is applied to the gate electrode of transistor 34 to apply the signal present at node B from a previous cycle to common video output line 30. To begin a new cycle a charge up or initialization pulse is applied from terminal 2 of ring counter 52 to the gate electrode of transistor 26 via a conductor 26' which applies a pulse of magnitude +V to the gate electrode of transistor 22. Transistor 22 turns on producing a voltage at node B which is equal to +V minus the threshold voltage $V_{T22}$ of transistor 22. Since transistor 24 is connected as a diode between node B and node C, which is coupled to ground through a parasitic capacitance CP, the voltage at node C is equal to +V minus the threshold voltage $V_{T22}$ of transistor 22 and minus the threshold voltage $V_{T24}$ of transistor 24. Thus, the voltage across the second capacitor C2 is equal to the sum of the threshold voltages of transistors 22 and 24, i.e., equal to $V_{T22} + V_{T24}$. After charging capacitor C2, a boost pulse is applied from terminal 3 of ring counter 50 to the gate electrode of transistor 28 via a conductor 28' to apply voltage +V to node C, which tends to raise the voltage at node A to the sum of $+V + V_{T22} + V_{T24}$. However, since capacitor C1, having a capacitance value equal to that of capacitor C2, is also connected to node A, the potential at node A rises to only the sum of $$+ V + \frac{V_{T22} + V_{T24}}{2}.$$

If the threshold voltages of transistors 22 and 24 were of equal value, the voltage at node A would be equal to the sum of $+V+V_{T24}$. Accordingly, the voltage across capacitor C2 eliminates the offset voltage at the gate of transistor 22, the amplifying device for the signals produced by the photo-diode PD1, thus the smallest increment of signal from photo-diode PD1 may be amplified by transistor 22. By forming transistor 24 adjacent to or in the proximity of transistor 22 in the integrated circuit substrate, the threshold voltages of transistors 22 and 24 may be made equal or may, if employing presently known integration processes, have a difference of less than 100 millivolts. This voltage difference would produce an error in the signal at node A of less than 50 millivolts.

Although the magnitude of the threshold voltage of the amplifying transistors 22 of the array is a variable, the circuit of the invention compensates for this variable on an individual transistor basis, since each of the amplifying transistors 22 along the array has associated with it in its proximity the diode-connected transistor 24. Therefore, regardless of the threshold voltage differences between, say transistors 22 in amplification circuit 10 and amplification circuit 20, which may differ by at least 250 millivolts, the diode-connected connected transistors 24 will have similar threshold voltages, i.e., within 100 millivolts, producing a maximum error of less than 50 millivolts at any sensing point in the array. It can be seen that if the +V supply is equal to 8 volts, the non-uniformity of error signal at any of the nodes A across the entire array would be less than 50/8000, or 0.625%.

The photo or light integration time at the photodiodes may be set for any predetermined time interval. This interval begins after the charge up pulse from, say, terminal 2 of ring counter 52 has been applied to the gate electrode of transistor 26 and ends with the application of the next transfer pulse from terminal 1 of ring counter 50 to the gate electrode of transistor 34. A suitable integration time may be from approximately 50 to 400 microseconds.

After the transfer pulse turns on transistor 34, the amplified signal at node B is applied to the common video line 30 for further amplification by an amplifier 46 which provides a strong video output signal at terminal 48.

It should be understood that in the interest of clarity only capacitors C1 and C2 have been indicated, even though, as is well known, integrated semiconductor circuits have many inherent capacitances, not shown, such as between nodes A, B and C and ground.

Although it is generally preferable to design capacitors C1 and C2 to have capacitances equal to each other, there may be times when it is desirable to have these capacitors at different values. In general, the boost pulse bootstraps the gate electrode of transistor 22 to a value equal to the sum of $$+ V + (V_{T22} + V_{T24}) \frac{C2}{C1 + C2}.$$

Figure 2:
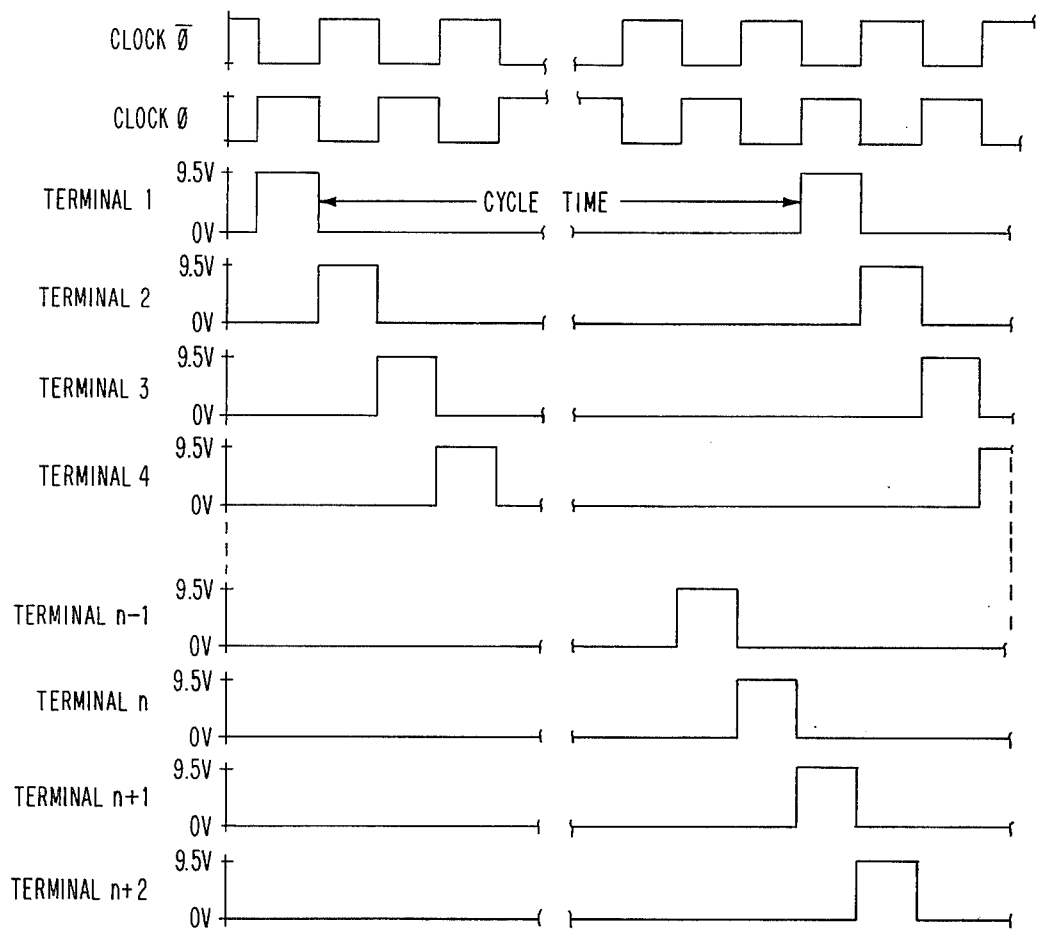
FIG. 2 is a pulse program used in connection with the operation of the circuits shown in FIG. 1.
Figure 2:
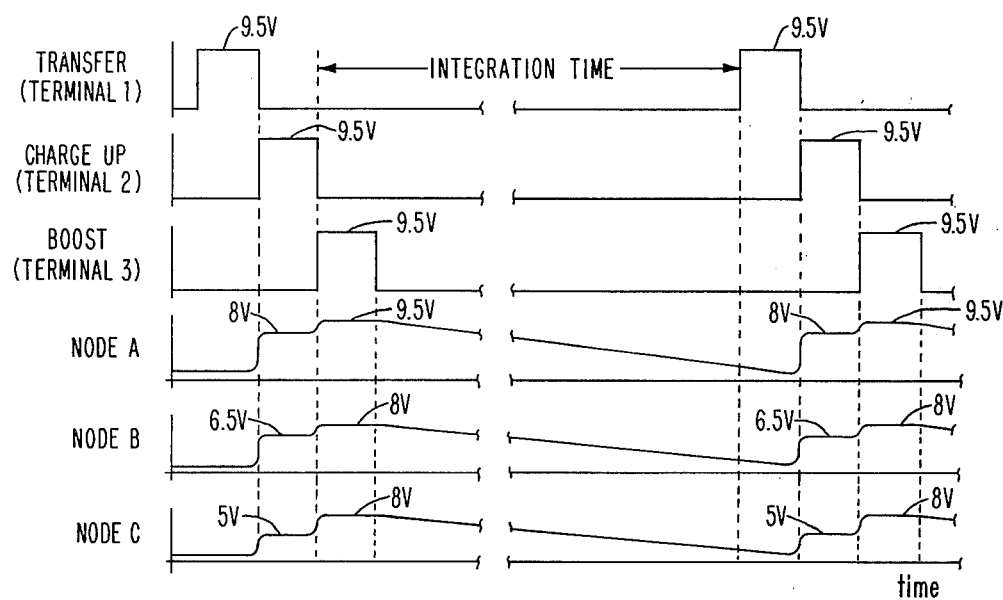

If it is assumed that +V is equal to +8 volts and that the magnitudes of the transfer, charge up and boost voltages are each equal to 9.5 volts, the voltages at nodes A, B and C during different portions of an operating cycle are as follows. When the charge up pulse is applied to the gate electrode of transistor 26, the voltage is equal to 8 volts at node A, 6.5 volts at node B, if $V_{T22}$ is assumed to be 1.5 volts, and 5.0 volts at node C, if $V_{T24}$ is assumed to also be 1.5 volts. Thus, the voltage across capacitor C2 is equal to 3 volts. When the boost pulse is applied to the gate electrode of transistor 28, the voltage at node A increases to 9.5 volts, assuming that the capacitors C1 and C2 have equal capacitance values, and the voltage at nodes B and C become 8 volts, as indicated in FIG. 2 of the drawing. It can be seen that as the voltage at node A decreases due to the charge accumulation in photo-diode PD1, the voltage at node B will decrease in direct proportion to the decrease at node A. At the end of the integration time, the transfer pulse will turn on transistor 34 to apply to the output line 30 the entire video signal produced at node B, which has a magnitude somewhat less than 8 volts depending upon the intensity of the incident light on photo-diode PD1.

It should be noted that the photo-diode charge amplification circuit 12 is similar to amplification circuit 10 except that the video signal from node B of amplification circuit 12 is applied to the common video output line 32 with the transfer pulse being applied to transistor 36 from terminal 2 of ring counter 52, the charge up pulse from terminal 3 of ring counter 50 and the boost pulse from terminal 4 of ring counter 52. Photo-diode charge amplification circuits 14 and 18 are similarly arranged as amplification circuit 10 except that transfer, charge up and boost pulses are applied from terminals 3, 4 and, e.g., n-1, and n-1, n and n+1, respectively, while photo-diode charge amplification circuits 16 and 20 are similarly arranged as amplification circuit 12 except that transfer, charge up and boost pulses are applied from terminals 4, e.g., n-1, and, e.g., n, and n, n+1 and n+2, respectively. The video signals from amplification circuits 14 and 18 are applied to output line 30 through transistors 38 and 42, respectively, and the video signals from amplification circuits 16 and 20 are applied to output line 32 through transistors 40 and 44, respectively.

As can be seen from FIG. 2, the pulses from terminals 1, 2, 3, 4, n-1, n, n+1 and n+2 are produced sequentially from the upper terminals to the lower terminals of the ring counters 50 and 52 and in the order in which the terminals are numbered. Accordingly, it can be seen that the video signals are applied to amplifier 46 alternately from the output line 30 and the output line 32. If desired, the circuits may be arranged and operated so that, e.g., the video signals from both amplification circuits 10 and 12 are applied simultaneously to a common amplifier to provide an indication of the light incident upon effectively a single photo-diode or photo-element having an area equal to that of twice the area of either photo-diode PD1 or PD2.

In order to operate the self-scanning photo-sensitive circuits including the linear array of photo-diodes PD1 through PDn, clock 54 is turned on to produce $\phi$ and $\bar{\phi}$ pulses which are applied to the ring counters 50 and 52, respectively. These pulses may be two sets of timing signals of the same frequency but of different phase, as indicated hereinabove. Alternatively, the same set of signals or pulses may be applied to both ring counters 50 and 52, but the ring counter 50 may be designed to be responsive to the positive going clock pulses, indicated in FIG. 2 of the drawing, and the ring counter 52 is then made responsive to the negative going clock pulses. Operation of both of the ring counters 50 and 52 begins simultaneously upon application of an appropriate pulse to the start terminal. The pulse at terminal n of ring counter 52 may be fed back to the start terminals and used as the start pulse for both ring counters 50 and 52, if desired. Although the end of scan occurs when the pulse at terminal n of ring counter 52 is applied to the control electrode of transistor 44, charge up and boost pulses are required from terminal n+1 of counter 50 and terminal n+2 of counter 52, respectively, for application to amplification circuit 20 to initiate the next integration period for photo-diode PDn.

It can thus be seen that the invention provides improved self-scanning photo-sensitive circuits which have improved uniformity and which can be operated at short integration times or low light intensities. By moving, e.g., a document, and the photo-sensitive array with respect to one another, signals indicative of the characters or information contained on the document may be readily produced. These signals may then be utilized to reproduce the document at the location of origin or at a distant location.

While the invention has been particularly shown and described with reference to preferred embodiments thereof, it will be understood by those skilled in the art that various changes in form and details may be made therein without departing from the spirit and scope of the invention.

What is claimed is:
1. A charge amplification circuit comprising
   first and second field effect transistors, each having a control electrode, a pair of current carrying elec- trodes and a predetermined threshold voltage loss, said second field effect transistor being connected as a diode in series with said first field effect transistor, the control electrode of said second transistor being connected to one of the current carrying electrodes of said first transistor, the other current carrying electrode of said first transistor being connected to a voltage source, a capacitor coupled between the control electrode of said first field effect transistor and the current carrying electrode of said second field effect transistor remote from said first field effect transistor, means for precharging said capacitor to the threshold voltage loss of said first and second transistors, means for applying a predetermined voltage to the common point between said capacitor and said second field effect transistor, and means for applying a signal to the control electrode of said first field effect transistor.

2. A charge amplification circuit as set forth in claim 1 wherein said signal applying means includes a photosensitive device having capacitive means.

3. A charge amplification circuit as set forth in claim 2 wherein the magnitudes of the capacitive of said capacitor and said capacitive means are substantially equal.

4. A charge amplification circuit as set forth in claim 3 wherein the magnitude of said predetermined voltage is such as to produce a substantially equal voltage at said one current carrying electrode of said first field effect transistor.

5. A video amplification circuit comprising
a photo-diode having capacitance means,
a first field effect transistor having a given supply voltage connected to its drain and said capacitance means connected to its control electrode,
a capacitor having a capacitance substantially equal to that of said capacitance means,
a second field effect transistor having its control and drain electrodes connected to the source electrode of said first transistor and its source electrode connected to one terminal of said capacitor, the other terminal of said capacitor being connected to the control electrode of said first transistor,
means for precharging said capacitor to the sum of the threshold voltage losses of said first and second transistors, and
means for applying to the source of said second transistor a voltage of a magnitude such as to produce a voltage of substantially equal magnitude at the source of said first transistor.

6. A video amplification circuit as set forth in claim 5 wherein said precharging means includes a third transistor for connecting said given supply voltage to the control electrode of said first transistor.

7. A video amplification circuit as set forth in claim 6 wherein voltage applying means applies said given supply voltage to the source of said second transistor.

* * * * *